(12) United States Patent
Hiblot et al.

(10) Patent No.: US 10,712,760 B2
(45) Date of Patent: Jul. 14, 2020

(54) LOW-TEMPERATURE VOLTAGE REFERENCE USING COULOMB BLOCKADE MECHANISM

(71) Applicant: IMEC VZW, Leuven (BE)

(72) Inventors: Gaspard Hiblot, Heverlee (BE); Bertrand Parvais, Nil-Saint-Vincent (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/452,143

(22) Filed: Jun. 25, 2019

(65) Prior Publication Data

US 2020/0004285 A1    Jan. 2, 2020

(30) Foreign Application Priority Data

Jun. 29, 2018 (EP) .................................... 18180932

(51) Int. Cl.
*G05F 1/595* (2006.01)
*H01L 29/76* (2006.01)

(52) U.S. Cl.
CPC .......... *G05F 1/595* (2013.01); *H01L 29/7613* (2013.01)

(58) Field of Classification Search
CPC . G05F 1/595; G05F 3/30; G05F 3/242; G05F 3/245; G05F 3/247; G05F 3/262;
(Continued)

(56) References Cited

U.S. PATENT DOCUMENTS

| 4,825,145 A | * | 4/1989 | Tanaka | ..................... G05F 3/247 323/315 |
| 5,434,842 A | * | 7/1995 | Weiss | ..................... B82Y 10/00 369/126 |

(Continued)

FOREIGN PATENT DOCUMENTS

| JP | 2002-289833 A | 10/2002 |
| KR | 10-2009-0034478 A | 4/2009 |

(Continued)

OTHER PUBLICATIONS

European Search Report, European Patent Application No. 18180932.8, dated Jan. 7, 2019, 8 pages.

(Continued)

*Primary Examiner* — Yemane Mehari
(74) *Attorney, Agent, or Firm* — McDonnell Boehnen Hulbert & Berghoff LLP

(57) ABSTRACT

Example embodiments relate to low-temperature voltage references using Coulomb blockade mechanisms. One embodiment includes a method of generating a reference voltage. The method includes providing a first single-electron transistor (SET) and a second SET connected in series. The method also includes biasing the first SET and the second SET using a same biasing current ($I_b$). Further, the method includes operating the first SET at a slope of a first Coulomb peak and the second SET at a slope of a second Coulomb peak. The slope of the first Coulomb peak and the second Coulomb peak are of the same slope type selected from a rising slope, a peak maximum, and a falling slope. The second Coulomb peak is different from the first Coulomb peak. Additionally, the method includes generating the reference voltage ($V_{ref}$) based on a difference between gate-to-source voltages of the first SET ($V_{gs1}$) and the second SET ($V_{gs2}$).

16 Claims, 2 Drawing Sheets

(58) Field of Classification Search
CPC . H01L 29/00; H01L 29/0895; H01L 29/7613; H01L 27/00; H01L 45/00; B82Y 10/00
USPC .................................. 323/313, 316; 257/30
See application file for complete search history.

(56) References Cited

U.S. PATENT DOCUMENTS

| | | | |
|---|---|---|---|
| 6,313,478 B1* | 11/2001 | Lee ................. | B82Y 10/00 257/30 |
| 2004/0108529 A1* | 6/2004 | Kang ............... | B82Y 10/00 257/288 |
| 2007/0200156 A1* | 8/2007 | Wunderlich ...... | B82Y 10/00 257/296 |
| 2016/0343839 A1 | 11/2016 | Kim | |
| 2018/0224878 A1* | 8/2018 | Schober ........... | G05F 3/245 |

FOREIGN PATENT DOCUMENTS

| | | | |
|---|---|---|---|
| WO | 94/03850 A2 | 2/1994 | |
| WO | 94/03850 A3 | 2/1994 | |

OTHER PUBLICATIONS

Bergsten, Tobias et al., "A Two-Dimensional Array of Tunnel Junctions Used for Coulomb Blockage Thermometry", Physica B, 284-288, 2000, pp. 1788-1789.

\* cited by examiner

LOW-TEMPERATURE VOLTAGE REFERENCE USING COULOMB BLOCKADE MECHANISM

CROSS-REFERENCE TO RELATED APPLICATIONS

The present application is a non-provisional patent application claiming priority to European Patent Application No. EP 18180932.8, filed Jun. 29, 2018, the contents of which are hereby incorporated by reference.

FIELD OF THE DISCLOSURE

The present disclosure relates to the field voltage references. In particular, the present disclosure relates to the generation of a stable reference voltage using single-electron transistors and Coulomb blockade effects.

BACKGROUND

Electronic circuits may need to be provided with a reference voltage in order to function properly. Optimally, such a reference voltage is stable over time and not dependent on e.g. variations in ambient temperature. Such reference voltages are normally provided using various bandgap voltage reference circuits in which transistors and suitable resistors are arranged such that one variation by temperature cancels, or at least to a first order compensates for, another variation by temperature, thereby leading to a temperature-independent current which may be converted into a temperature-independent reference voltage. In such conventional bandgap voltage reference circuits, the current may be dominated by diffusion which may be suppressed at low temperatures (<50 K) thereby making the bandgap voltage reference circuits unsuitable for low-temperature electronics.

As an alternative, a stable voltage may be generated at low temperature by using circuits utilizing the Josephson effect in which a generated current depends only on applied RF frequency and fundamental constants. Such circuits, although functional also at low temperature, may be complex and require advanced control electronics in order to work.

There is therefore a need for an improved way of generating of a stable voltage reference at low temperature.

SUMMARY

To at least partially fulfil the above needs, the present disclosure seeks to provide an improved way of generating a reference voltage. To achieve this, a method of generating a reference voltage and a reference voltage generator as defined in the independent claims are provided. Further embodiments of the present disclosure are provided in the dependent claims.

According to a first aspect of the present disclosure, a method of generating a reference voltage is provided. The method may include providing a first single-electron transistor (SET) and a second SET connected in series with the first SET. The method may include biasing the first SET and the second SET using a same biasing current. The method may include operating the first SET at a slope of a first Coulomb peak, wherein the slope of the first Coulomb peak is of a slope type selected from a rising slope, a peak maximum, and a falling slope. The method may include operating the second SET at a slope of a second Coulomb peak different from the first Coulomb peak, wherein the slope of the second Coulomb peak is of the same slope type as the slope of the first Coulomb peak. The method may further include generating the reference voltage based on a difference between a gate-to-source voltage of the first SET and a gate-to-source voltage of the second SET.

Herein, a SET is envisaged as a device having a region (or island) connected (i.e. by tunnel junctions) between its drain and source terminals, and wherein the electric potential on this region/island may be tuned by applying a voltage between the gate terminal (capacitively coupled to the region/island) and the source terminal. It is also envisaged that such a SET may be operated such that the energy required to add an extra electron charge to the region/island exceeds the thermal energy on the region/island. This may be obtained from, e.g., a combination of sufficiently low temperature and a sufficiently small region/island.

If a SET is operated in the Coulomb blockade regime, the drain-to-source current through the SET may oscillate as a function of applied gate-to-source voltage and give rise to so called Coulomb peaks. A voltage distance between adjacent Coulomb peaks may be constant, and may be proportional (or equal) to the electron charge divided (scaled) by a sum capacitance of the SET (e.g. $e/C_\Sigma$). A voltage distance between non-adjacent peaks may also be constant, and may correspond to a multiple of the electron charge divided by the sum capacitance of the SET (e.g. n times $e/C_\Sigma$ where n is an integer). Depending on temperature, the widths of the peaks may vary. The distance between adjacent peaks may however be temperature-independent. If, as will also be described in more detail later herein, the first SET and the second SET are operated at different Coulomb peaks, but at a same slope type (i.e. rising, peak maximum, or falling), a difference in gate-to-source voltage between the operating points of the first SET and the second SET may be constant and independent of variations in temperature. A reference voltage generated based on a difference between the gate-to-source voltages of the first SET and the second SET may be stable with respect to temperature variations, and also be provided at low temperatures where e.g. a conventional bandgap circuit would not work. The present disclosure therefore provides a reference voltage suitable for low-temperature electronics, such as electronics operated at cryogenic temperature and used e.g. for quantum computing or similar.

As will be illustrated in more detail later herein, a "slope type" of a Coulomb peak may be interpreted as a certain side of the summit of the Coulomb peak. If, for example, a SET is operated at a certain Coulomb peak but at a gate-to-source voltage below the very summit of the peak, the SET may be said to operate at a rising slope of the Coulomb peak. Likewise, if the SET is operated at a gate-to-source voltage equal to, or above, the summit of the peak, the SET may be said to operate at a peak maximum (slope type) or a falling slope of the peak, respectively.

In some embodiments, connecting the first SET and the second SET in series may include connecting a drain terminal of the first SET to a source terminal of the second SET. Phrased differently, a current through the first SET and the second SET, when drawn schematically, may be envisaged as entering the second SET first and then to continue towards the first SET.

In some embodiments, the first SET and the second SET may be underlapped MOSFETs (SET-MOSs), metallic islands, nanotubes, single-electron molecules, epitaxial electron-boxes (formed e.g. using Stranski-Krastanow growth over a larger bandgap (isolating) material), or combinations thereof. Here, that a SET "may be" e.g. a metallic island means that the region/island of the SET is provided by a metallic island, but implies that the necessary tunnel barriers and capacitive couplings to this region/island are also provided in a suitable way.

In some embodiments, operating the first SET and the second SET at the same slope type may include making (temporary) operation at different slope types unstable. As will be described later herein, such operation may force both SETs to operate at a same slope type.

In some embodiments, making operation at different slope types unstable may include sensing a drain voltage of at least one of the first SET and the second SET as a feedback voltage, and regulating a current (e.g. the biasing current) through the first SET and the second SET based on this feedback voltage. The feedback loop circuit may for example have a certain gain and be loop stable. It is envisaged that the feedback loop provided by the feedback loop circuit may be analog.

In some embodiments, the regulating may include using a feedback regulation element adapted to regulate the current through the first SET and the second SET based on the feedback voltage.

In some embodiments, operating the first SET and the second SET at slopes of different Coulomb peaks may include using at least one window selector circuit.

In some embodiments, the at least one window selector circuit may be adapted to restrict (e.g. cut off) a current (e.g. the biasing current) through the first SET and the second SET if at least one of the gate-to-source voltage of the first SET and the gate-to-source voltage of the second SET is outside a corresponding voltage window around the first Coulomb peak and a corresponding voltage window around the second Coulomb peak, respectively.

According to a second aspect of the present disclosure, a reference voltage generator is provided. The reference voltage generator may include a first single-electron transistor (SET) and a second SET connected in series with the first SET. The reference voltage generator may include a current biasing circuit which may be adapted to bias the first SET and the second SET using a same biasing current. Phrased differently, the biasing circuit may be adapted to provide a same drain-to-source current through the first SET and the second SET. The reference voltage generator may include at least one window selector circuit which may be adapted to cause the first SET to operate at a slope of a first Coulomb peak, and to cause the second SET to operate at a second Coulomb peak different from the first Coulomb peak. The reference voltage generator may include a feedback loop circuit which may be adapted to (further) operate the first SET and the second SET such that a slope type of the slope of the first Coulomb peak and a slope type of the slope of the second Coulomb peak is a same slope type selected from a rising slope, a peak maximum, and a falling slope. The reference voltage generator may further include an output circuit which may be adapted to output a reference voltage based on a difference between a gate-to-source voltage of the first SET and a gate-to-source voltage of the second SET. It is also envisaged that the output circuit may be adapted to only output e.g. the individual gate-to-source voltages, from which the reference voltage may be created by e.g. forming a difference. As described earlier herein, a difference between the gate-to-source voltages of the first SET and the second SET may correspond to the difference between the (first and second) Coulomb peaks. This difference may be stable with respect to temperature variations, and may thereby provide a suitable voltage reference also for low-temperature (e.g. cryogenic) electronic circuits and similar.

In some embodiments, the at least one window selector circuit may include circuitry for detecting a first condition wherein the gate-to-source voltage of the first SET is outside a first voltage window around the first Coulomb peak, and for detecting a second condition wherein the gate-to-source voltage of the second SET is outside a second voltage window around the second Coulomb peak. The at least one window selector circuit may further include at least one window switching element which may be adapted to restrict (e.g. cut off) a current through the first SET and the second SET if at least one of the first condition and the second condition is satisfied. The at least one window switching element may for example be provided in the current path through which the drain-to-source current through the series-connected first SET and second SET flows.

In some embodiments, the feedback loop circuit may include a feedback regulation element controlled by a drain voltage of at least one of the first SET and the second SET and adapted to regulate a current (e.g. the biasing current) through the first SET and the second SET based on the drain voltage. The feedback regulation element may for example be provided in the current path through which the drain-to-source current through the series-connected first SET and second SET flows.

In some embodiments, the feedback regulation element may be adapted to increase the current through the first SET and the second SET if the drain voltage is decreasing, thereby making one type of slope unstable.

In some embodiments, at least one or both of the window switching element and the feedback regulation element may be a transistor. The operation of such a transistor will be described in more detail later herein.

The present disclosure relates to all possible combinations of features recited in the claims. Further, any embodiment described with reference to a method of generating a reference voltage according to the first aspect may be combinable with any of the embodiments described with reference to the reference voltage generator according to the second aspect, or vice versa.

Further objects of the various embodiments of the present disclosure will be described below using example embodiments.

BRIEF DESCRIPTION OF THE DRAWINGS

Example embodiments will be described below with reference to the accompanying drawings, in which.

Figure 1:
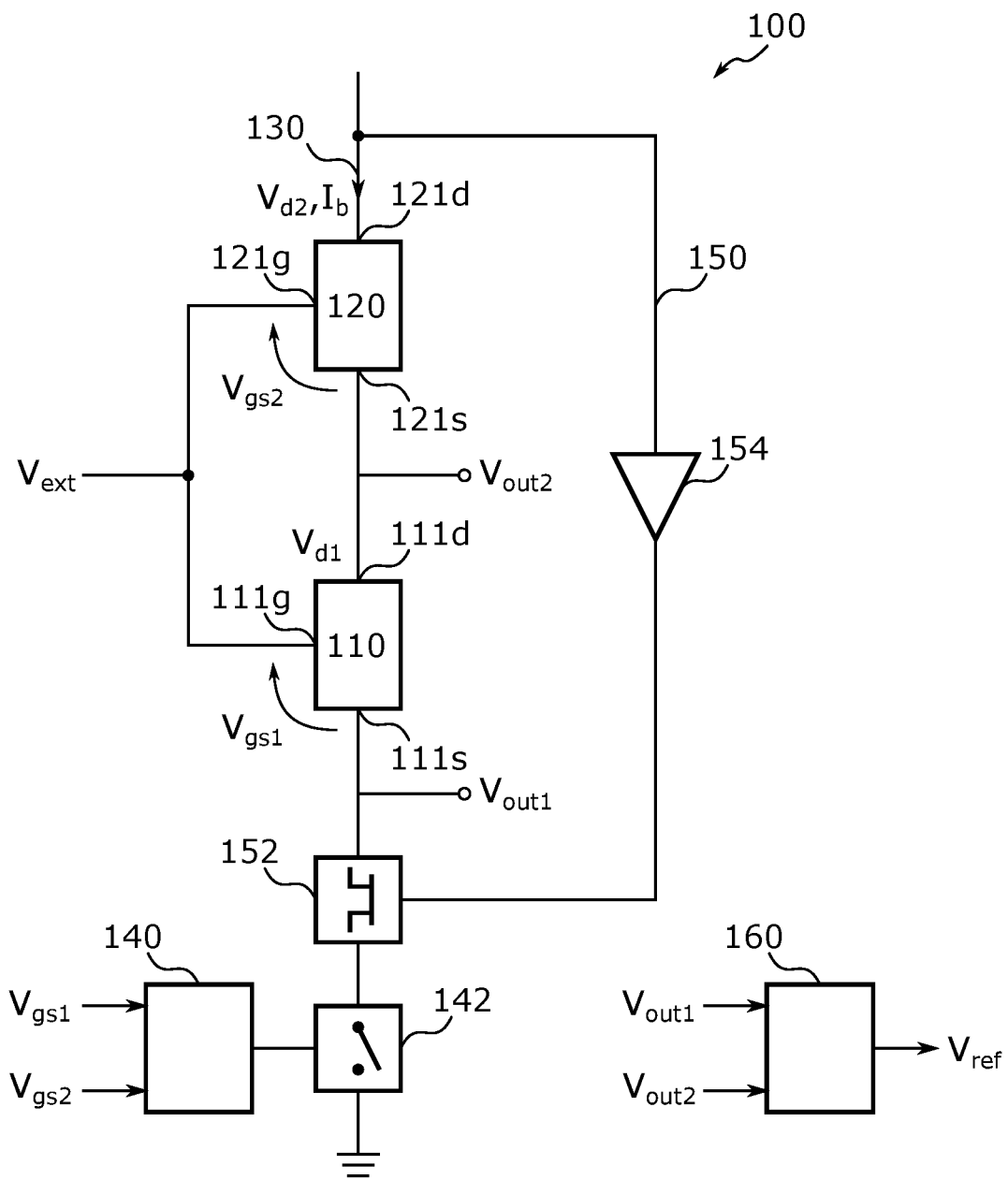
FIG. 1 is a schematic illustration of a reference voltage generator, according to example embodiments.

In the drawings, like reference numerals will be used for like elements unless stated otherwise. Unless explicitly stated to the contrary, the drawings show only such elements that are necessary to illustrate the example embodiments, while other elements, in the interest of clarity, may be omitted or merely suggested. As illustrated in the figures, the sizes of elements and regions may not necessarily be drawn to scale and may e.g. be exaggerated for illustrative purposes and, thus, are provided to illustrate the general structures of the embodiments.

DETAILED DESCRIPTION

Example embodiments will now be described more fully hereinafter with reference to the accompanying drawings.

The drawings show example embodiments, but the invention may, however, be embodied in many different forms and should not be construed as limited to the embodiments set forth herein; rather, these embodiments are provided for thoroughness and completeness, and fully convey the scope of the present disclosure to the skilled person.

Figure 2:
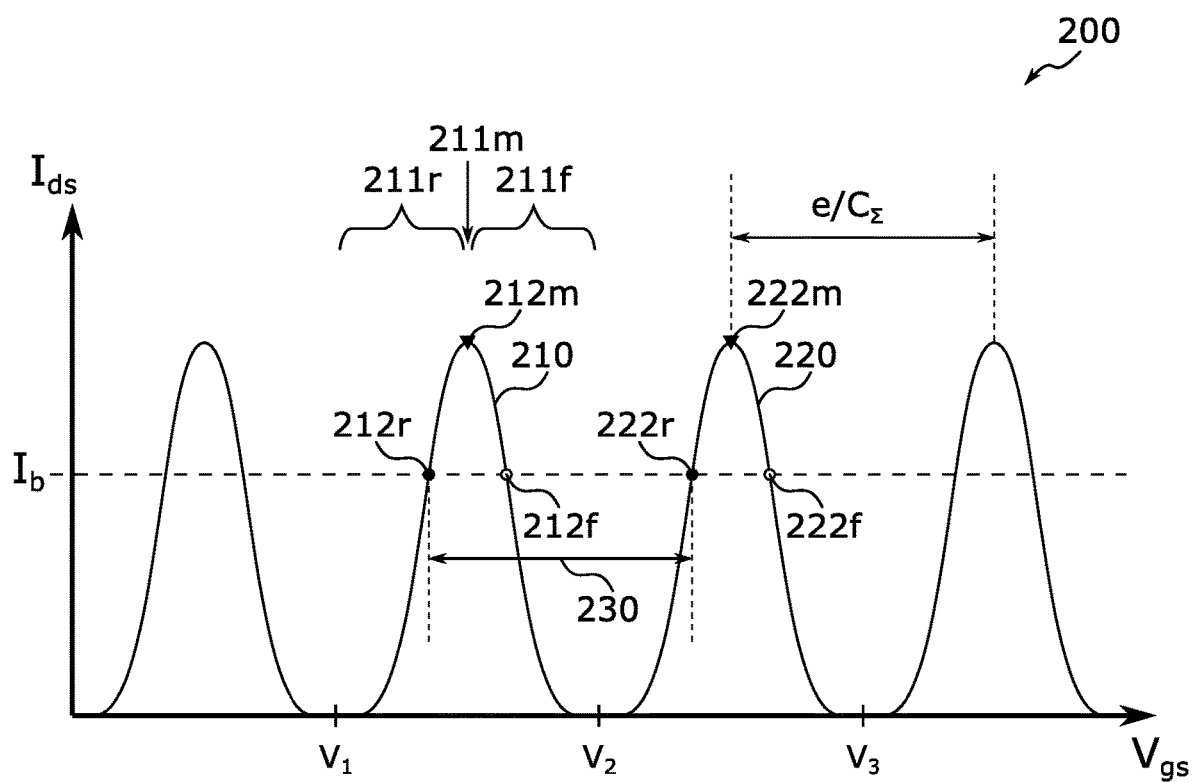
FIG. 2 is a plot of drain-to-source current in a single-electron transistor as a function of applied gate-to-source voltage, according to example embodiments.

With reference to FIG. 1 and FIG. 2, the (method for) generation of a reference voltage and a reference voltage generator according to embodiments of the present disclosure will now be described in more detail.

FIG. 1 illustrates schematically an embodiment of a reference voltage generator 100 according to the present disclosure.

FIG. 2 illustrates schematically a plot 200 of the drain-to-source current ($I_{ds}$) through a single-electron transistor (SET) as a function of applied gate-to-source voltage ($V_{gs}$). As described earlier herein, due to the Coulomb blockade effect, the drain-to-source current in a SET (provided the SET is operating in the Coulomb blockade regime) displays a series of oscillations (e.g. Coulomb peaks 210 and 220) with varying gate-to-source voltage. A voltage distance between adjacent peaks is constant, and may correspond e.g. to the electron charge divided (scaled) by a sum capacitance of the SET (e.g. $e/C_\Sigma$). A voltage distance between non-adjacent peaks is also constant, and may correspond to a multiple of the electron charge divided by a sum capacitance of the SET (e.g. n times $e/C_\Sigma$ where n is an integer). Depending on temperature, the widths of the peaks may vary while the distance between adjacent peaks remains unchanged.

The reference voltage generator 100 includes a first SET 110 and a second SET 120. The first SET 110 has a drain terminal 111$d$, a source terminal 111$s$ and a gate terminal 111$g$. Likewise, the second SET 120 has a drain terminal 121$d$, a source terminal 111$s$ and a gate terminal 111$g$. The source 121$s$ of the second SET 120 and the drain 111$d$ of the first SET 110 are connected, such that the first SET 110 and the second SET 120 are connected in series.

For example, an SET (such as the first SET 110 and/or the second SET 120) may be provided as an underlapped MOS (SET-MOS), wherein skipped doping below the gate may provide the region/island in form of a quantum well. The SET may also be provided e.g. as small metallic island, a nanotube, a single-electron molecule, an epitaxial electron-box, or similar.

A biasing circuit (not shown) is used to bias the first SET 110 and the second SET 120 using a same biasing current 130 ($I_b$). The biasing current 130 ($I_b$) is also illustrated by the horizontal dashed line in FIG. 2. It is understood how to construct a suitable current biasing circuit (e.g. a current mirror), and the biasing circuit will therefore not be described in further detail. In the reference voltage generator 100, an external bias voltage $V_{ext}$ is applied to the gate terminals 111$g$ and 121$g$ of the first SET 110 and the second SET 120 respectively.

A window selector circuit 140 is provided which takes as its input the gate-to-source voltage ($V_{gs1}$) of the first SET 110 and the gate-to-source voltage ($V_{gs2}$) of the second SET 120. The window selector circuit 140 is adapted to operate the first SET 110 at a slope of a first Coulomb peak (such as the Coulomb peak 210), and to operate the second SET 120 at a slope of a second Coulomb peak different from the first Coulomb peak (such as the Coulomb peak 220). The window selector circuit 140 may for example compare the voltages $V_{gs1}$ and $V_{gs2}$ with respective voltage windows, and operate a window switching element 142 (which may form a part of the window selector circuit 140) to restrict (e.g. cut off) a current (e.g. the biasing current) through the first SET 110 and the second SET 120 once any of the voltages $V_{gs1}$ and $V_{gs2}$ is outside its respective window. For example, the window for the first SET 110 may correspond to the window between the voltages $V_1$ and $V_2$, and the window for the second SET 120 may correspond to the window between the voltages $V_2$ and $V_3$, as illustrated in FIG. 2. The values of $V_1$, $V_2$, and $V_3$ may be provided externally to the window selector circuit 140, or be obtained by the window selector circuit 140 itself by e.g. analysis of the input gate-to-source voltages. The window selector circuit may operate in a digital fashion. The comparison may be implemented e.g. by using digital (or analog, or a combination of both digital and analog) logic, and a control signal to the switching element 142 may be output from such logic such that the switching element 142 may opened and cut off the current through the first SET 110 and the second SET 120 (or at least be operated to restrict the current) if at least one of the voltages $V_{gs1}$ and $V_{gs2}$ is detected to lie outside its corresponding voltage window. In this way, the first SET 110 and the second SET 120 may be controlled to operate at respective, and different, first 210 and second 220 Coulomb peaks. The window switching element 142 may for example be a transistor, wherein the signal from the window selector circuit 140 is applied on the gate (or base) of this transistor. The transistor may for example be a voltage controlled transistor (such as a MOS-transistor), or a current controlled transistor (such as a bipolar junction transistor, BJT, where the signal from the window selector circuit 140 is then a current signal, or a voltage signal converted into a base current), or any other suitable switching element which may be controlled to be in either a closed (current-conducting) state or in an open (non-current-conducting) state.

As illustrated in FIG. 2, a Coulomb peak (e.g. the Coulomb peak 210) may have a rising slope 211$r$, a peak maximum 211$m$ and a falling slope 211$f$. If e.g. the first SET 110 is operated at a rising slope of the first Coulomb peak 210, the operating point of the first SET 110 may be the filled circle 212$r$. Similarly, if the first SET 110 is operated at a peak maximum, or a falling slope, of the first Coulomb peak 210, the operating point of the first SET 110 may be the filled triangle 212$m$ or the empty circle 212$f$, respectively. Likewise, the operating point of the second SET 120 may be the filled circle 222$r$ (corresponding to operation at a rising slope of the second Coulomb peak 220), the filled triangle 222$m$ (corresponding to operation at a peak maximum of the second Coulomb peak 220), or the empty circle 222$f$ (corresponding to operation at a falling slope of the second Coulomb peak 220). Herein, a region of a Coulomb peak referred to as a "rising slope" may not necessarily need to have a derivative which is positive everywhere in this region. It is envisaged that there may be one or more sections of the region wherein the derivative may be negative, but as long as a sum/integral over the derivative of the region is positive the region may be referred to as a "rising slope". Likewise, a region of a Coulomb peak referred to as a "falling slope" may not necessarily need to have a derivative which is negative everywhere in this region, but as long as a sum/integral over the derivative of the region is negative the region may be referred to as a "falling slope". Finally, a slope type corresponding to a "peak maximum" may have neither a positive or negative derivative, but correspond to the maximum (i.e. the "summit") of the Coulomb peak itself.

To further make the first SET 110 and the second SET 120 operate not only at different Coulomb peaks, but also on a same slope type of their respective Coulomb peak (i.e. both on a rising slope, both at a peak maximum or both at a falling slope), the reference voltage generator 100 may include a feedback loop circuit 150. In the illustrated embodiment of the reference voltage generator 100, the feedback loop circuit 150 senses a (feedback) voltage at a drain terminal of the second SET 120 (e.g. the drain voltage $V_{d2}$), and provides this sensed voltage (feedback voltage) to a feedback regulation element 152. The feedback regulation element 152 may, based on the feedback voltage, regulate the current (e.g. the biasing current) through the first SET 110 and the second SET 120. The amplifier 154, although illustrated in the embodiment shown in FIG. 1, may be optional or have unit gain. The feedback loop circuit 150 may include some gain, provided e.g. by the amplifier 154 or by another device, and be loop stable. The feedback loop circuit 150, e.g. in contrast with the window selector circuit 140, may operate in an analog fashion, The feedback loop circuit 150, although illustrated in FIG. 1 as a single-input/single-output circuit, may in some embodiments also be more complex. In general, it is envisaged in the present disclosure that, with the help of the feedback control circuit 150, a situation in which the first SET 110 and the second SET 120 temporarily operates at different slope types (e.g. if the first SET 110 operates at a rising slope of the Coulomb peak 210, as indicated by the filled circle 212r, and the second SET 120 operates at a falling slope of the Coulomb peak 220, as indicated by the empty circle 222f) may be made unstable. The feedback control circuit 150 may force the first SET 110 and the second SET 120 to operate at slopes of a same type (e.g. both at filled circles 212r and 222r, both at empty circles 212f and 222f, or both at peak maxima indicated by filled triangles 212m and 222m). The feedback regulation element 152 (which may form part of the feedback loop circuit 150) may for example be a transistor, wherein the feedback voltage provided by the feedback loop circuit 150 is applied on a gate of this transistor (if the transistor is a voltage controlled transistor, e.g. an MOS, or converted into a current which is provided to a base of this transistor (if the transistor is a current controlled transistor, e.g. a BJT). The provided feedback voltage (or current) may regulate the amount of (e.g. biasing) current which passes through the feedback regulation element 152, thereby regulating the (e.g. biasing) current through the first SET 110 and the second SET 120. For example, in some embodiments, the feedback regulation element (transistor) 152 may be adapted to increase the current through the first SET 110 and the second SET 120 if the drain voltage ($V_{d1}$ or $V_{d2}$) is decreasing, thereby making one type of slope unstable.

If the feedback regulation element 152 is a transistor, the transistor may for example be an n-type transistor. If applicable, the transistor 152 may be an enhancement mode or depletion mode transistor, or e.g. be a FinFET or similar having a fully depleted channel. It is also envisaged that the feedback loop circuit 150 may be constructed differently, and for example be inverted (starting from e.g. $V_{dd}$). In such a situation, the transistor 152 may e.g. be a p-type transistor.

The reference voltage generator 100 may further include an output circuit 160. The output circuit 160 may take as its input the voltages $V_{out1}$ and $V_{out2}$ (as illustrated in FIG. 1), and may form a reference voltage $V_{ref}$ based on e.g. a difference between $V_{out1}$ and $V_{out2}$. Such a difference may correspond to a difference between the gate-to-source voltage $V_{gs1}$ of the first SET 110 and the gate-to-source voltage $V_{gs2}$ of the second SET 120. The output circuit 160 may for example include a differential amplifier or similar, or any other suitable circuit from which a difference between $V_{out1}$ and $V_{out2}$ may be extracted.

As the first SET 110 and the second SET 120 are forced to operate at the same slope type (i.e. the same side of, or at, the respective maximum) of different Coulomb peaks, the difference between the gate-to-source voltages may correspond to a multiple of the electron charge (scaled e.g. by a sum capacitance of the SET(s)), independent of temperature. Such a difference is indicated in FIG. 2 by the arrow 230, corresponding to one times the electron charge divided by a sum capacitance of the SET(s). If the first and second Coulomb peaks are not adjacent, the difference may correspond to a multiple larger than one times the electron charge divided by a sum capacitance of the SET(s).

As the two SETs are operated at a same biasing current (i.e. they have a same source-to-drain current passing through them), and at different Coulomb peaks but at a same slope type of these peaks, the reference voltage $V_{ref}$ output by the output circuit 160 may therefore be stable with varying temperature conditions, and suitable for use as a reference voltage also in circuits at low temperature. This is contrary to e.g. conventional bandgap circuits which, due to the suppression of their diffusion-dominated current may cease to work at low temperatures (e.g. below 50 K). In addition, the reference voltage generator 100 may provide a less complex alternative to e.g. voltage references based on the Josephson effect and operated using well-defined RF frequency.

The person skilled in the art realizes that the present disclosure is by no means limited to the embodiments described above. On the contrary, many modifications and variations are possible within the scope of the appended claims.

Although features and elements are described above in particular combinations, each feature or element may be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

What is claimed is:

1. A method of generating a reference voltage, comprising:
    providing a first single-electron transistor (SET) and a second SET connected in series with the first SET;
    biasing the first SET and the second SET using a same biasing current ($I_b$);
    operating the first SET at a slope of a first Coulomb peak, wherein the slope of the first Coulomb peak is of a slope type selected from a rising slope, a peak maximum, and a falling slope;
    operating the second SET at a slope of a second Coulomb peak, wherein the second Coulomb peak is different from the first Coulomb peak, and wherein the slope of the second Coulomb peak is of the same slope type as the slope of the first Coulomb peak; and
    generating the reference voltage ($V_{ref}$) based on a difference between a gate-to-source voltage ($V_{gs1}$) of the first SET and a gate-to-source voltage ($V_{gs2}$) of the second SET.

2. The method of claim 1, wherein connecting the first SET and the second SET in series comprises connecting a drain terminal of the first SET to a source terminal of the second SET.

3. The method of claim 1, wherein the first SET and the second SET comprise underlapped MOSFETs, metallic islands, nanotubes, single-electron molecules, or epitaxial electron-boxes.

4. The method of claim 1, wherein operating the first SET and the second SET at the same slope type comprises making operation at different slope types unstable.

5. The method of claim 4, wherein making operation at different slope types unstable comprises:
sensing a drain voltage ($V_{d1}$; $V_{d2}$) of at least one of the first SET and the second SET as a feedback voltage; and
regulating a current through the first SET and the second SET based on the feedback voltage.

6. The method of claim 5, wherein regulating the current through the first SET and the second SET based on the feedback voltage comprises using a feedback regulation element adapted to regulate the current through the first SET and the second SET based on the feedback voltage.

7. The method of claim 1, wherein operating the first SET and the second SET at slopes of different Coulomb peaks comprises using at least one window selector circuit.

8. The method of claim 7, wherein the at least one window selector circuit is adapted to restrict a current through the first SET and the second SET if:
the gate-to-source voltage of the first SET is outside a first voltage window ($[V_1, V_2]$) around the first Coulomb peak; or
the gate-to-source voltage of the second SET is outside a second voltage window ($[V_2, V_3]$) around the second Coulomb peak.

9. A reference voltage generator, comprising:
a first single-electron transistor (SET) and a second SET connected in series with the first SET;
a current biasing circuit adapted to bias the first SET and the second SET using a same biasing current ($I_b$);
at least one window selector circuit adapted to cause the first SET to operate at a slope of a first Coulomb peak and to cause the second SET to operate at a slope of a second Coulomb peak, wherein the second Coulomb peak is different from the first Coulomb peak;
a feedback loop circuit adapted to further operate the first SET and the second SET such that a slope type of the slope of the first Coulomb peak and a slope type of the slope of the second Coulomb peak are a same slope type selected from a rising slope, a peak maximum, and a falling slope; and
an output circuit adapted to output a reference voltage ($V_{ref}$) based on a difference between a gate-to-source voltage ($V_{gs1}$) of the first SET and a gate-to-source ($V_{gs2}$) voltage of the second SET.

10. The reference voltage generator of claim 9, wherein the first SET and the second SET are connected in series by connecting a drain terminal of the first SET to a source terminal of the second SET.

11. The reference voltage generator of claim 9, wherein the first SET and the second SET comprise underlapped MOSFETs, metallic islands, nanotubes, single-electron molecules, or epitaxial electron-boxes.

12. The reference voltage generator of claim 9, wherein the at least one window selector circuit comprises:
circuitry adapted to:
detect a first condition where the gate-to-source voltage of the first SET is outside a first voltage window ($[V_1, V_2]$) around the first Coulomb peak; and
detect a second condition wherein the gate-to-source voltage of the second SET is outside a second voltage window ($[V_2, V_3]$) around the second Coulomb peak; and
at least one window switching element adapted to restrict a current through the first SET and the second SET if the first condition or the second condition is satisfied.

13. The reference voltage generator of claim 12, wherein the window switching element is a transistor.

14. The reference voltage generator of claim 9, wherein the feedback loop circuit comprises a feedback regulation element controlled by a drain voltage ($V_{d1}$; $V_{d2}$) of at least one of the first SET and the second SET and adapted to regulate a current through the first SET and the second SET based on the drain voltage.

15. The reference voltage generator of claim 14, wherein the feedback regulation element is adapted to increase the current through the first SET and the second SET if the drain voltage is decreasing, thereby making one type of slope unstable.

16. The reference voltage generator of claim 14, wherein the feedback regulation element is a transistor.

* * * * *